United States Patent [19]
Curling et al.

[11] Patent Number: 5,973,312
[45] Date of Patent: Oct. 26, 1999

[54] ARRAY OF PHOTOSENSITIVE PIXELS

[75] Inventors: Catherine J. Curling; Neil C. Bird, both of Horley, United Kingdom

[73] Assignee: U.S. Philips Corporation, New York, N.Y.

[21] Appl. No.: 09/022,452

[22] Filed: Feb. 12, 1998

[30] Foreign Application Priority Data

Feb. 13, 1997 [GB] United Kingdom .................. 9702991

[51] Int. Cl.⁶ .................................................. H01J 40/14
[52] U.S. Cl. ........................................ 250/208.1; 257/296
[58] Field of Search ........................... 250/208.1, 214 R, 250/239; 257/431, 434, 435, 296, 291

[56] References Cited

U.S. PATENT DOCUMENTS 4,797,560  1/1989  Berger et al. .......................... 250/578
5,463,232  10/1995  Yamashita et al. .................... 257/223

*Primary Examiner*—Que T. Le
*Attorney, Agent, or Firm*—Steven R. Biren

[57] ABSTRACT

The array comprises an insulating substrate with diode-capacitor pixels disposed over conductors on the substrate. A single mask is used to etch the pixel stacks, and each pixel stack is wider than the conductor beneath. As a result, the mask alignment does not influence the pixel characteristics.

10 Claims, 5 Drawing Sheets

ARRAY OF PHOTOSENSITIVE PIXELS

BACKGROUND OF THE INVENTION

This invention relates to arrays of photosensitive pixels, for example for use in image sensors. The invention is particularly concerned with array configurations which enable a reduction in the size of image sensor pixels, so that an image sensor having an increased resolution may be produced.

Various pixel configurations are known which may be used to form a large area photosensitive array. Generally, the photosensitive pixel of a large area array comprises a light-collecting device, such as a photodiode, and a switching device such as a light-shielded diode. In this arrangement, the charge stored on the capacitance of the photodiode is used to provide an indication of the level of light previously incident on the photosensitive pixel.

A known alternative pixel configuration is one in which the photodiode acts as the switching device, and a separate capacitor is required for charge storage. U.S. Pat. No. 4,797,560 discloses an array of photosensitive pixels in which each pixel comprises a photodiode and a capacitor in series, disposed one above the other over a common substrate. The capacitor and photodiode of each pixel comprise thin film layers disposed over the common substrate. Each pixel in U.S. Pat. No. 4,797,560 comprises a single stack of thin film layers, and this enables the stack to occupy a small area (because the photodiode can occupy almost the full area of the pixel) enabling an increased resolution of an image sensor using the pixel configuration. However, the alignment of the pixel stack over previously formed conductors is critical, and the capacitance of each pixel is dependent on this alignment.

SUMMARY OF THE INVENTION

According to the invention there is provided an array of photosensitive pixels comprising:
  an insulating substrate;
  a plurality of conductors provided on the substrate, each conductor defining a contact region associated with a group of one or more pixels, the conductors having a predetermined first width; and
  a plurality of pixels, each pixel comprising a pixel stack disposed over an associated conductor, the pixel stack comprising a capacitor and a photodiode in series with each other and disposed one over the other with respect to the substrate, the capacitor and the photodiode occupying substantially the same area over the substrate, the capacitor including a metal contact layer and a dielectric layer, the metal contact layer being disposed on the opposite side of the dielectric layer to the photodiode, wherein a width of the pixel stack is greater than the width of the associated conductor.

In the pixel configuration according to the invention, the metal contact layer of the capacitor provides a peripheral contact area for the pixel stack which has the same shape as the remaining parts of the pixel stack. As a result, the alignment of the pixel stack has no effect on the capacitance of each pixel. The pixel stack has a width greater than the width of the conductor, so that the lateral positioning of each pixel stack over the conductors is not critical. Furthermore, the layers in the pixel stack may all be etched using a single mask to form the pixel stacks from layers covering the substrate, so that the formation of each pixel stack does not require alignment of different etching masks.

The capacitor of each pixel stack may be disposed over the associated conductor with the photodiode disposed over the capacitor. In this way, the metal contact layer forms the base of the pixel stack, so that the alignment of the stack over the (smaller) conductors does not affect the pixel characteristics.

Alternatively, the photodiode of each pixel stack may be disposed over the associated conductor with the capacitor disposed over the photodiode. In this way, the metal contact layer forms a top contact layer of the pixel stack.

The photodiode in each pixel stack preferably comprises a series of amorphous silicon semiconductor layers which may be etched using the same dry etching process as used for the capacitor.

The pixels may be arranged in rows and columns, each having associated row and column conductors, and the conductors provided on the substrate may define the column conductors. Thus, the pixel array may form the photosensitive array of a large area two dimensional image sensor.

The invention also provides a method of producing an array of photosensitive pixels on a common insulating substrate, comprising:
  defining a plurality of conductors on the substrate, each having a predetermined width;
  depositing a plurality of layers over the substrate, the layers comprising a set of capacitor layers and a set of photodiode layers, disposed one set over the other set, the capacitor layers comprising at least a first metal contact layer and a dielectric insulating layer, the metal contact layer being disposed on the opposite side of the dielectric insulating layer to the set of photodiode layers;
  etching the capacitor and photodiode layers using a single mask to form pixel stacks, each comprising a photodiode, defined by the photodiode layers, and a capacitor, defined by the capacitor layers, in series and occupying the same area over the substrate, each pixel stack being provided over a respective conductor, and the base of the pixel stack making electrical contact with the respective conductor; and
  providing a second contact layer over the pixel stacks which makes electrical contact with the top of each pixel stack, wherein a width of each pixel stack is greater than the width of the respective conductor.

As described above, the use of a single mask to form each pixel stack avoids the need for accurate alignment of individual masks.

The capacitor dielectric layer may be removed from areas of the substrate outside the array of photosensitive pixels, for example using a dry etching technique, before the application of the remaining layers. Alternatively, a mask may prevent deposition of the capacitor dielectric from those areas of the substrate. In this way, the stacks formed outside the array of photosensitive pixels comprise diode layers only, enabling peripheral circuitry to be formed from diodes.

The capacitor layers may further comprise a second metal layer adjacent the set of photodiode layers, and this second metal layer may define base contacts for the diodes in the peripheral circuitry, which can improve the performance of the peripheral circuitry diodes, particularly the resistance of the connection of the diodes to the tracks of the peripheral circuitry.

The conductors may be formed by depositing a chromium layer over the substrate and forming the conductors of predetermined width using a wet etching technique.

BRIEF DESCRIPTION OF THE DRAWINGS

The invention will now be described by way of example, with reference to and as shown in the accompanying drawings, in which.

DESCRIPTION OF THE PREFERRED EMBODIMENTS

Figure 1:
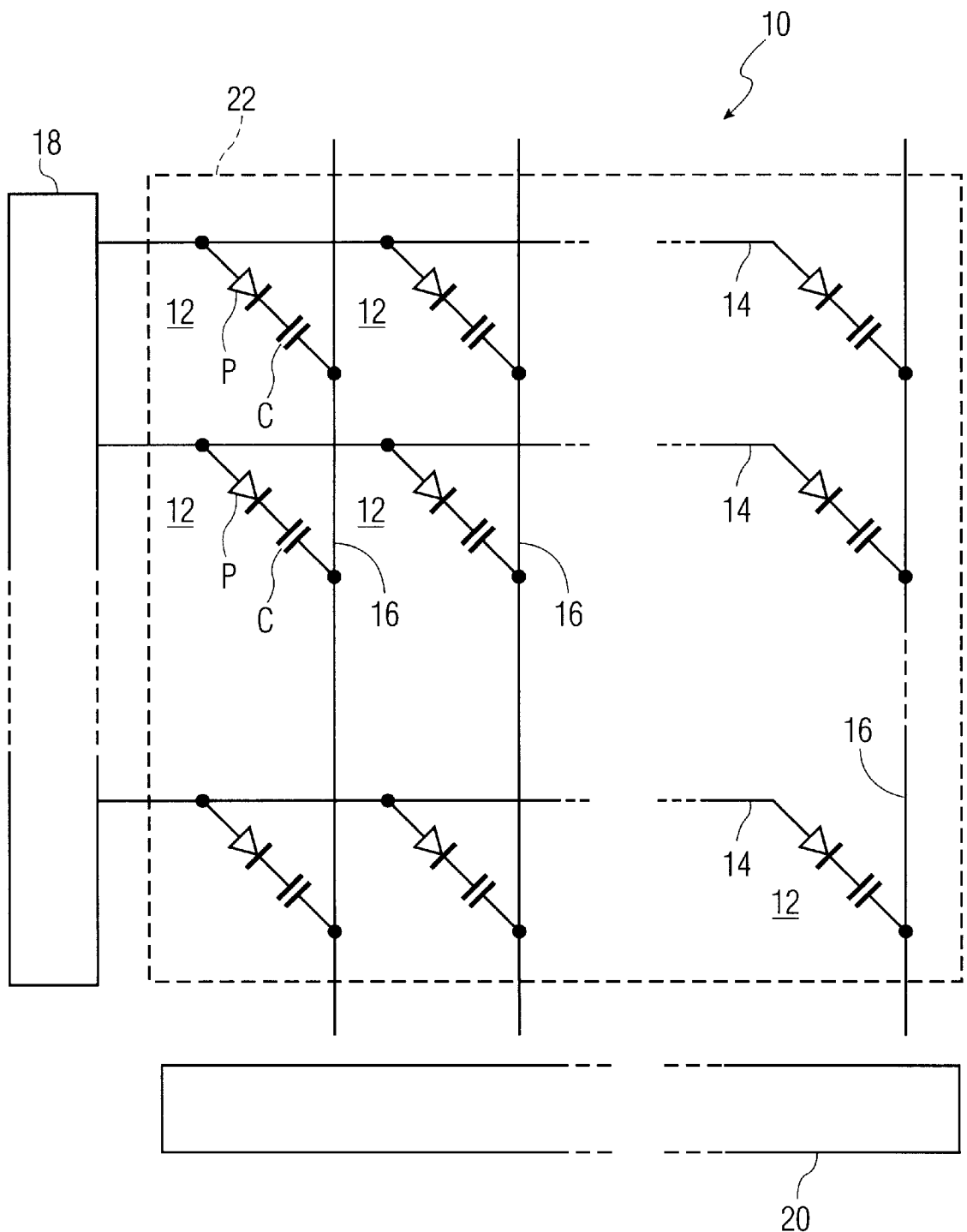
FIG. 1 shows, in simplified form, an image sensor using an array of photosensitive pixels of known configuration.

FIG. 1 shows in simplified form the basic components of an image sensor using an array of photosensitive pixels. The sensor 10 comprises rows and columns of pixels 12 having associated row and column conductors 14, 16. The pixels 12 are addressed by row pulses applied to the row conductors 14 by a row driver circuit 18. Signals are read out from the pixels 12 by means of the column conductors 16 using a column reading circuit 20. Those skilled in the art will appreciate the different techniques for operating an image sensor and a detailed description of the possible operating schemes will not be given.

The pixels 12 are formed on a common substrate and together form a pixel array 22. Furthermore, portions of the row driver circuit 18 and the column reading circuit 20 may also be formed on the common substrate. For example, either circuit may include multiplexers, electrostatic protection diodes, or modulating circuits, which may be integrated on to the substrate of the pixel array 22. In the case of multiplexer circuits, this enables the number of connections to the common substrate to be reduced.

The pixels 12 shown in FIG. 1 each comprise a photosensitive diode P and a capacitor C connected in series between a respective row conductor 14 and column conductor 16. The column conductor 16 may be held at a constant potential by the column reading circuit 20 so that the signals applied to the row conductor 14 determine whether the photodiode P is forward biased or reverse biased. When the photodiode P is reverse biased, any light incident on the photodiode gives rise to a current which has the effect of discharging the capacitance C. When a row pulse is subsequently applied to the row conductor 14 to forward bias the photodiode P, a current flows between the respective row conductor 14 and column conductor 16 to recharge the capacitance C. This current is measured by the column reading circuits 20 to evaluate the previous light intensity incident on the pixel being measured.

Figure 2:
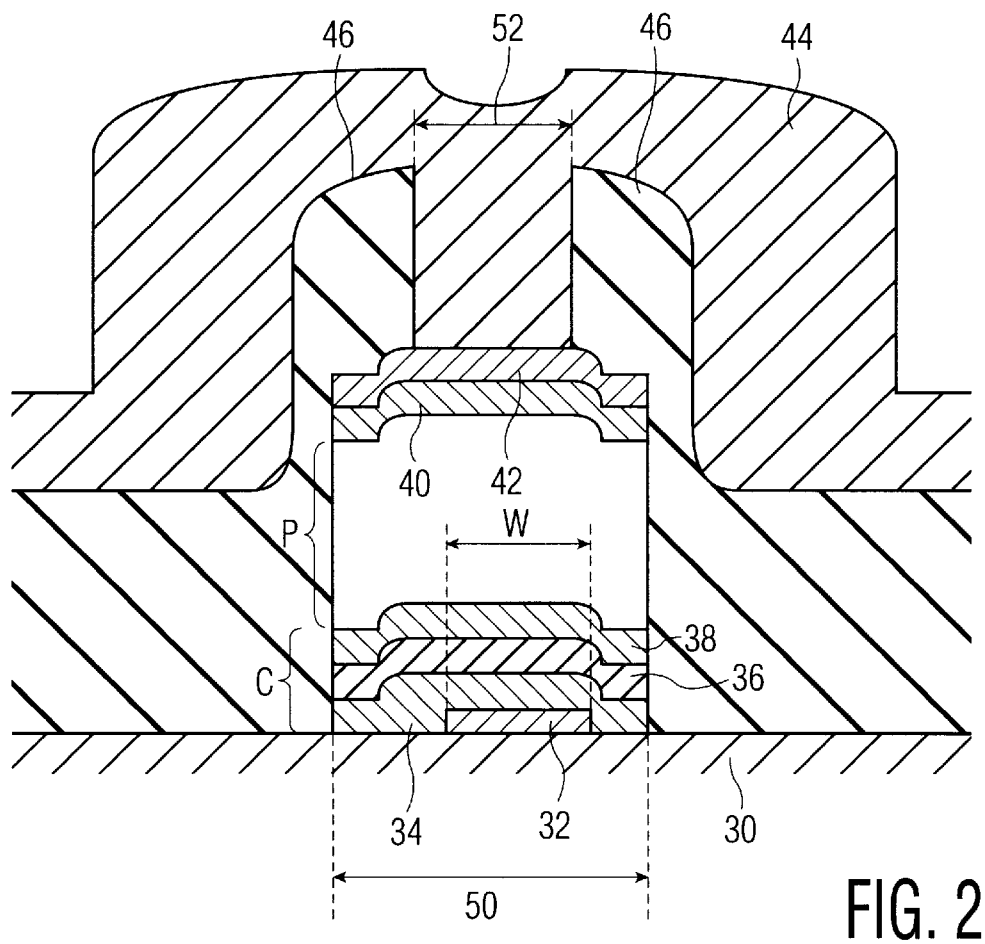
FIG. 2 shows, in cross section, a first pixel configuration according to the invention.

FIG. 2 shows, in cross section, a first pixel structure according to the invention for implementing the photodiode and capacitor arrangement shown in FIG. 1.

The pixels 12 are provided on a common substrate 30, for example a glass substrate. The column conductors 14 are provided over the substrate 30, in the form of chromium tracks 32. The tracks 32 have a width W which is less than the width of each pixel stack as will be explained in the following. In the embodiment of FIG. 2, the capacitor C of each pixel is disposed over the chromium track 32 and comprises a metal contact layer 34 which defines a base contact, a dielectric layer 36 and a metal top contact 38. The dielectric layer may, for example, comprise a hydrogenated silicon nitride layer. The photodiode P of each pixel is then disposed over the capacitor C and comprises amorphous silicon layers defining a photodiode structure. For example, the photodiode may comprise an n-type semiconductor layer disposed over the capacitor C, an intrinsic semiconductor layer disposed over the n-type layer and a p-type semiconductor layer disposed over the intrinsic semiconductor layer. These layers have not been represented in detail in FIG. 2.

In the example shown in FIG. 2, the pixel is arranged to receive light from above the pixel, and for this purpose a transparent electrode layer 40 is provided above the photodiode P, for example a layer of ITO (Indium Tin Oxide). For this reason, the n-i-p configuration described above is preferred, with the (thinner) p-layer at the light receiving face of the photodiode. Finally, a metal contact layer 42 is deposited over the ITO layer 40 and acts as a contact for the respective row conductor 14.

The row conductor 14 is defined by a metal layer 44 which makes contact with the contact layer 42 through an opening 52 in a passivation layer 46.

As will be described in the following, the outer dimensions of the pixel stack are defined by a single mask, so that the formation of the stack is not sensitive to misalignment of any masks. Furthermore, the metal base layer 34 of the stack ensures that the capacitor C has a constant effective contact area, and thereby a constant capacitance, which is also not sensitive to misalignment of the pixel stack over the metal track 32. As a result, the mask can be aligned using contact or proximity aligners rather than more accurate and expensive projection systems. The use of a stacked pixel structure also enables the photodiode and the capacitor of each pixel to occupy a maximum area within the pixel, thereby enabling a reduction in the size of the pixel (for a given photodiode area) and a consequent increase in the resolution of an image sensor using the array of pixels.

It is also possible to dispose the capacitor C over the photodiode P with respect to the substrate. In this case, the metal contact layer of the capacitor is at the top of the pixel stack which ensures that the connection to the top of the pixel is not sensitive to mask misalignment and the capacitance remains constant. This alternative pixel configuration is suitable for back-illumination systems. A p-i-n diode structure is then preferred so that the p-type amorphous silicon is adjacent the substrate. A transparent base contact may also be provided between the column conductor and the photodiode.

The processes by which the pixel configuration shown in FIG. 2 may be produced, and the possible materials to be used, will now be described. The full process steps will not be described in detail, since those skilled in the art will appreciate the need for various conventional processes in addition to the basic operations described below, for example repeated cleaning, rinsing and drying steps.

Initially, a chromium layer is deposited over the entire substrate 30, for example by a sputtering process, and subsequent wet etching forms the tracks 32 which define the column conductors 16. Of course, any conducting layer may be used to form the tracks, and chromium is only one example of a suitable metal layer.

The column conductors are defined to have a width which is less than the width (in the same lateral direction) of the pixel stacks. Thus, slight lateral misplacement of the pixel stacks does not affect the connection between the capacitor and the tracks. Furthermore, when the column conductors are provided as linear tracks, longitudinal misplacement of the pixel stacks (along the direction of the tracks) also does not affect the correct electrical connection of the pixels to the conductors. The conductors have a minimum width which depends upon the processing techniques used to deposit the tracks, and the smaller the track width, the less critical is the lateral positioning of the pixel stacks. Of course, the functions of the rows and columns may be interchanged, so that the conductors on the substrate may define row conductors. Alternatively, the array may be organised differently, for example as a linear array of pixels, and the tracks 32 should therefore be considered merely as base contacts over which the pixels must be aligned.

The capacitor base layer and dielectric are then formed over the tracks. These layers may comprise a tungsten base layer 34 (which is sputtered), and a silicon nitride dielectric layer (which may be formed by a plasma enhanced chemical vapour deposition process, PECVD) which are deposited over the entire substrate 30. Again, other base layers may be considered, as well as other dielectric layers. It is desirable for the base layer 34 to be formed from a different metal to the metal of the track 32, so that an etchant may be selected for the metal base layer 34 of the pixel stack which is relatively insensitive to the material of the track 32. This will be apparent from the following description of the etching process.

At this stage, it may be desirable to carry out an etching step on regions of the substrate 30 outside the array 22 of pixels. For example, these regions may be allocated to portions of the row driver circuitry 18 or column reading circuitry 20 (FIG. 1) which fall outside the pixel array 22. Thus, a dry or wet etching process may be carried out to remove the dielectric layer 36, and optionally the base layer 34, from peripheral areas of the substrate 30 whilst leaving substantially intact the tracks 32 on those areas of the substrate 30. As stated above, an etchant is required which will not damage the tracks 32 and is therefore relatively insensitive to the material of the tracks. Of course, the tracks should be formed from a different material to the metal base layer. Instead of removing these layers, a mechanical mask may be used to prevent deposition of at least the dielectric layer 36 over the peripheral circuitry. A mechanical mask simply shields the row driver circuit and/or the column reading circuit 20 during deposition of the dielectric layer 36 (and optionally base layer 34).

The second metal layer 38 is then deposited, for example by sputtering. The metal is preferably the same as the metal of the first layer 34, for example tungsten. This layer provides electrical contact between the capacitor and the photodiode. However, the layer 38 is optional and may be omitted if direct contact between the dielectric 36 and the amorphous silicon photodiode layers may be suitable. In particular, lateral conduction within the capacitor structure is not required, and therefore direct contact between the dielectric and the amorphous silicon may give sufficient conduction between the capacitor and the photodiode.

The amorphous silicon layers of the photodiode P are then deposited over the second metal layer, if present, for example using a PECVD process.

The final layers of the pixel stacks are the transparent ITO layer 40 and the contact layer 42, which may be deposited by sputtering. The ITO layer provides an anti-reflection layer. The contact layer 42, which is preferably a chromium layer, might be required to prevent the reduction of the ITO by the plasma used to deposit the subsequent silicon nitride layer 46. The contact layer 42 may be omitted if the transparent layer may provide adequate electrical contact.

At this stage the entire pixel array 22 is covered by the layers which define the pixel stacks, and the regions of the substrate 30 outside the pixel array 22 are covered only by the diode layers.

In order to form the pixel stacks, a single mask may be employed, which shields the areas of the pixel array 22 corresponding to pixel stacks, as represented by arrow 50. This mask may comprise a conventional photoresist layer deposited over the areas corresponding to the pixel stacks. A photoresist layer is formed by exposing unwanted areas of a photoresist layer to ultraviolet light and etching away those exposed areas.

Once the mask is in place, the array is initially subjected to wet etching processes which remove the upper chromium contact layer 42 and the ITO layer 40. During these wet etching processes, the chromium of the tracks 32 is not affected, because it is covered by the amorphous silicon of the photodiode layers. The array is then subjected to a dry etching process, using the same mask, which then removes the amorphous silicon layers and capacitor layers, thereby leaving pixel stacks in the pixel array 22. The dry etching process has relatively little effect on the chromium tracks 32 between the pixel stacks, so that the column connectors are not damaged. To enable this, the tracks 32 are formed from a different metal to the capacitor layers. For example, an etching process may be selected which penetrates tungsten at a much higher rate than chromium. The etching process also provides individual diodes on the substrate in areas outside the pixel array 22 which may be used to form circuitry on the substrate 30 forming part of the row driver circuit 18 and/or column reading circuit 20.

Instead of this two stage etching process (using a single mask), the pixel stacks may be subjected to a single dry etching process, if a suitable etchant is available to remove all of the layers defining the pixel stacks. If a single etching step is to be performed, the metal of the track 32 should be insensitive to the single etchant, and therefore a different metal should be used for the track 32 as for all other metal layers within the pixel stacks. The choice of materials for the capacitor and photodiode layers will therefore be selected with the etching requirements in mind.

After etching of the pixel stack, the passivation layer 46 is deposited over the entire pixel array 22, and may comprise hydrogenated silicon nitride, although any suitable insulating protective layer may be employed.

Openings 52 are etched into each pixel stack to form apertures over each pixel stack which expose the contact layer 42. A conventional masking process is again used for this purpose. The openings 52 serve both for enabling the row conductors 14 to make contact with the top of each pixel stack and to enable light to enter the pixels.

Finally, the upper metal layer 44 is deposited over the array and is etched using a further mask to define the row conductors 14. An etchant is selected which removes the metal layers 42, 44, but has relatively little effect on the ITO layer 40 or the passivation layer 46. Consequently, this final etching stage may be used both to define the row conductors 14 and to create openings in the metal (chromium) contact layer 42 enabling the passage of light through the transparent ITO layer 40 into the photodiode structure.

Figure 3:
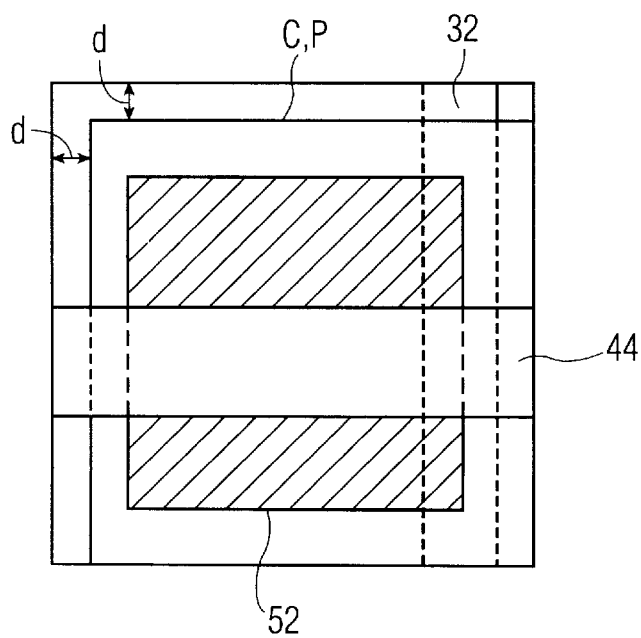
FIG. 3 shows in plan view the pixel configuration of FIG. 2.

The arrangement of the row and column conductors can best be seen from a plan view of the pixel as shown in FIG. 3. The upper metal layer 44 defines a row conductor 14 extending across the pixel. When the upper metal layer is etched, the passivation layer acts as a shield to protect the edges of each pixel stack, whereas in the window 52 in the passivation layer, the contact layer 42 is etched away so that the ITO layer 40 is exposed. The hatched area in FIG. 3 represents exposed portions of the ITO layer 40. The passivation layer 46 covers the array, and is only removed from the openings defined by the window 52. Light is able to enter the pixel stack through the hatched area in FIG. 3.

The pixel arrangement shown in FIGS. 2 and 3 has the advantage that the conductors 14, 16 defined by the layers 32, 44 only overlap through the pixel stack. Consequently, the capacitive coupling between rows and columns is kept to a minimum. Furthermore, this configuration allows the pixel stack to occupy the maximum area of the pixel, with a separation d between pixel stacks which may be reduced to the minimum possible separation which may be achieved whilst ensuring correct position and formation of the pixel stacks.

The reduction of row to column cross-over capacitance enables a reduction in the overall capacitive loading on the column reading circuitry, which improves the possible signal-to-noise ratio.

Figure 4:
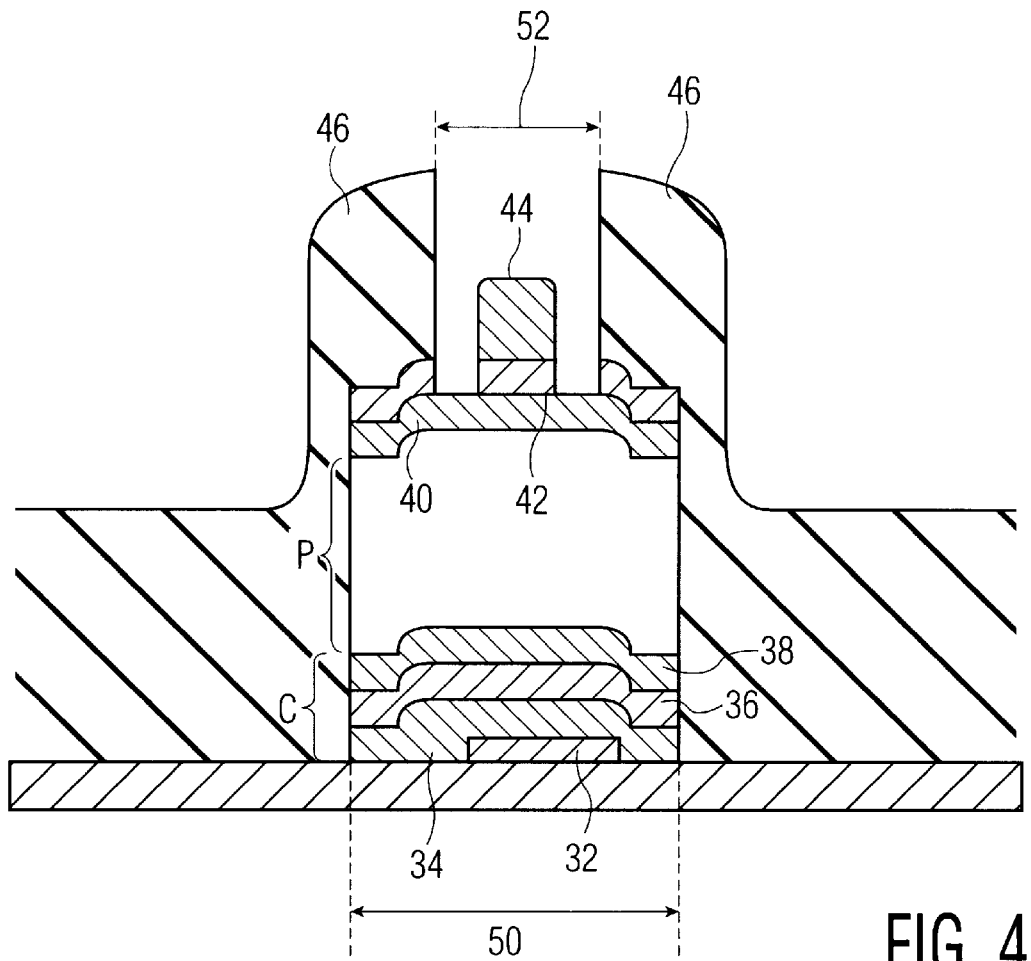
FIG. 4 shows, in cross section, a second pixel configuration according to the invention.

An alternative pixel configuration is shown in FIG. 4 in which the same layers constitute the pixel stack. For this reason, the same reference numerals have been used as in FIG. 2, and the procedure for depositing the pixel stacks is not described. After the pixel stack is formed, by etching all layers between the contact layer 42 and the tungsten based contacts 34, the silicon nitride passivation layer 46 is again applied, as in the structure of FIG. 2. The window 52 is opened in the passivation layer 46, leaving the contact layer 42 intact. Again, this corresponds to the procedure used for the pixel configuration of FIG. 2. Once more, the pixel array is covered with the upper metal layer 44, which may be chromium and/or aluminium, which is subsequently etched to form the row conductors 14. In the example of FIG. 4, the arrangement of the row conductors 40 defines a linear row with strap connections to each pixel stack. The portion of the conductor 44 shown in FIG. 4 represents a tie to the pixel stack, and this can be seen more clearly with reference to FIG. 5. Again, the hatched area represents the portion of the pixel stack for which the ITO layer 40 is exposed to incident light and the exposed regions on either side of the strap of the row conductor 14 in FIG. 5 can be seen in the cross-sectional view of FIG. 4.

The advantage of the pixel configuration shown in FIG. 4 is that if a discontinuity occurs in layer 44 in the region of the tie, the operation of only the associated pixel will be affected. The connection of the layer 44 to the top of the pixel stack is the region most likely to suffer mechanical imperfections, because of the stepped contour which the conductor 44 overlies, leading to step coverage problems. In the pixel arrangement of FIG. 2, any break in the conductor will result in the entire row of pixels being disabled.

Figure 5:
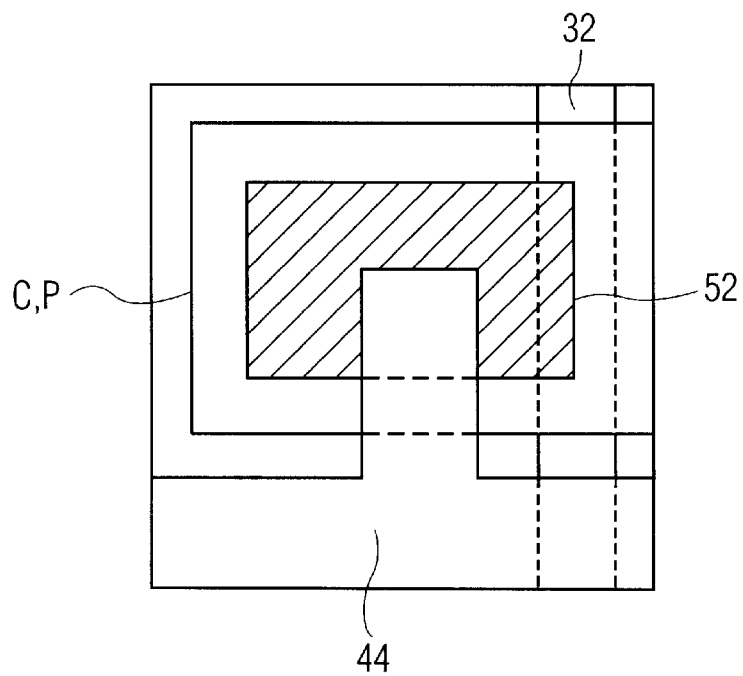
FIG. 5 shows in plan view the pixel configurations of FIG. 4.

The pixel configuration of FIG. 5 has a higher cross-over capacitance, and a smaller proportion of the substrate area is occupied by the pixel stacks.

Figure 6:
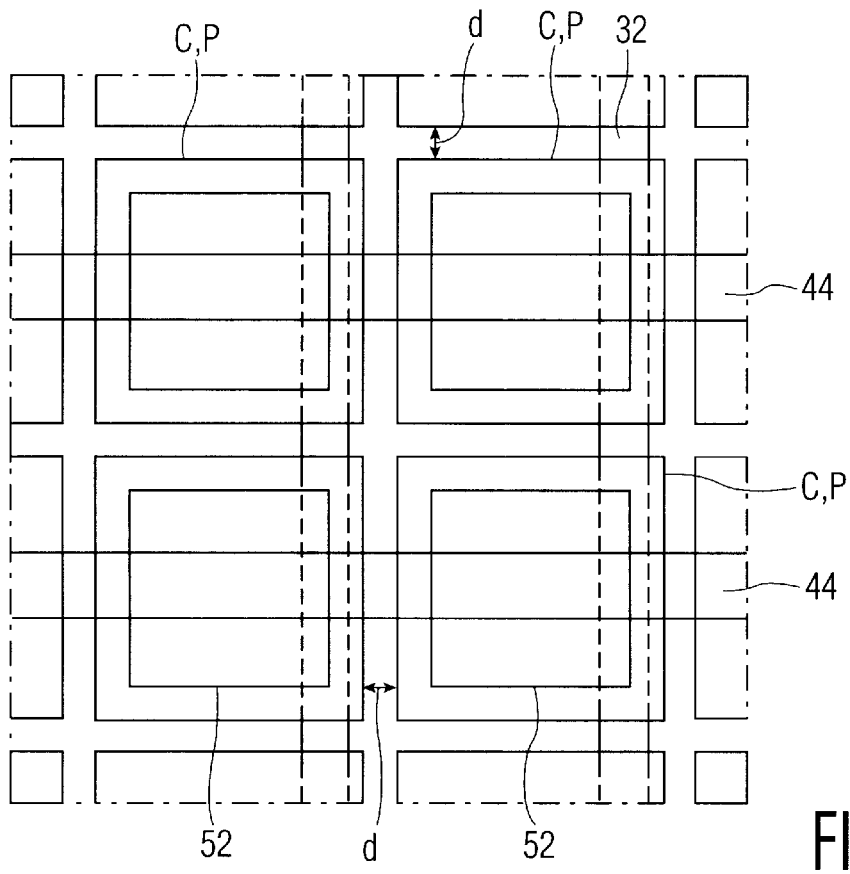
FIG. 6 shows in plan view an array of pixels based on the configuration of FIG. 2.
Figure 7:
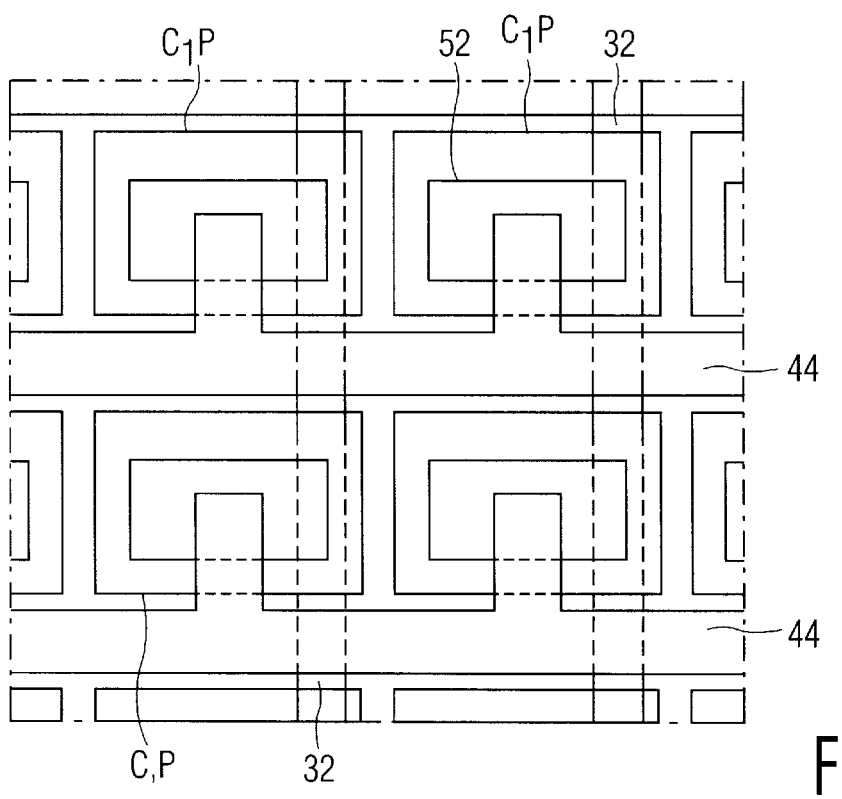
FIG. 7 shows in plan view an array of pixels based on the configuration shown in FIG. 4.

FIGS. 6 and 7 show the pixel arrangements of FIGS. 2 and 3, and of FIGS. 4 and 5 respectively, arranged in an array. Although only four complete pixels are shown, it will be appreciated that an array of many hundreds or thousands of pixels may be fabricated using either pixel configuration. For example, pixels have been fabricated in an array having a resolution of 800 dpi (dots per inch) which corresponds to a pixel pitch of 32 micrometers. The vertical stacking of each pixel, and the reduction of the spacing d between pixel stacks enables this resolution to be achieved.

The detailed description above relates to an image sensor pixel adapted to receive light from above the substrate. As stated above, the invention can also be applied to a back-illuminated pixel array, and one possible configuration is shown in FIG. 8.

Figure 8:
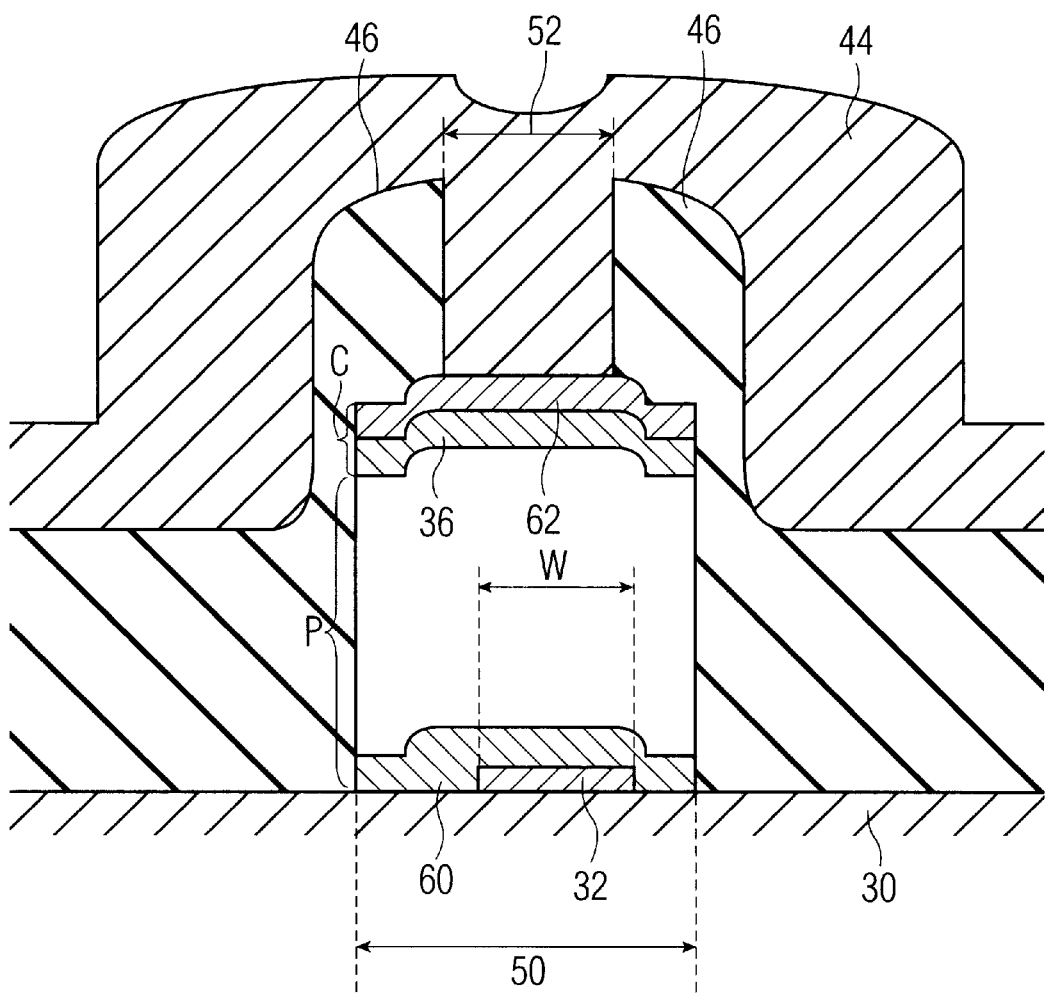
FIG. 8 shows, in cross section, a third pixel configuration according to the invention.

The pixel stack in FIG. 8 comprises a metal base contact layer 60 of transparent metal, for example ITO, over the column conductors 32. The photodiode layers P are provided over the base contact layer 60, and the capacitor dielectric layer 36 overlies the photodiode P. Optionally, a metal layer may be provided between the photodiode P and the dielectric 36, and the dielectric (and the optional metal layer) may be removed form the peripheral circuitry. The capacitor again comprises a metal contact layer 62 which forms a top contact of the pixel stack. The contact layer 62 again ensures that the capacitance of the pixel is not sensitive to mask misalignment, for example misalignment of the mask defining the contact openings 52. The processes used for manufacture of the pixel configuration of FIG. 8 will not be described, as they can easily be derived from the previous description of the embodiment of FIG. 2.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. An array of photosensitive pixels comprising:
   an insulating substrate;
   a plurality of conductors provided on the substrate, each conductor defining a contact region associated with a group of one or more pixels, the conductors having a predetermined first width; and
   a plurality of pixels, each pixel comprising a pixel stack disposed over an associated conductor, the pixel stack comprising a capacitor and a photodiode in series with each other and disposed one over the other with respect to the substrate, the capacitor and the photodiode occupying substantially the same area over the substrate, the capacitor including a metal contact layer and a dielectric layer, the metal contact layer being disposed on the opposite side of the dielectric layer to the photodiode, wherein a width of the pixel stack is greater than the width of the associated conductor.

2. An array as claimed in claim 1, wherein the capacitor of each pixel stack is disposed over the associated conductor and the photodiode is disposed over the capacitor, the metal contact layer forming a base metal layer of the pixel stack.

3. An array as claimed in claim 1, wherein the photodiode of each pixel stack is disposed over the associated conductor and the capacitor is disposed over the photodiode, the metal contact layer forming a top contact layer of the pixel stack.

4. An array as claimed in claim 1, wherein the capacitor of each pixel stack further includes a second metal layer disposed between the dielectric layer and the photodiode.

5. An image sensor comprising an array of photosensitive pixels as claimed in claim 1.

6. A method of producing an array of photosensitive pixels on a common insulating substrate, comprising:

defining a plurality of conductors on the substrate, each having a predetermined width;

depositing a plurality of layers over the substrate, the layers comprising a set of capacitor layers and a set of photodiode layers, disposed one set over the other set, the capacitor layers comprising at least a first metal contact layer and a dielectric insulating layer, the metal contact layer being disposed on the opposite side of the dielectric insulating layer to the set of photodiode layers;

etching the capacitor and photodiode layers using a single mask to form pixel stacks, each comprising a photodiode, defined by the photodiode layers, and a capacitor, defined by the capacitor layers, in series and occupying the same area over the substrate, each pixel stack being provided over a respective conductor, and the base of the pixel stack making electrical contact with the respective conductor; and providing a second contact layer over the pixel stacks which makes electrical contact with the top of each pixel stack, wherein a width of each pixel stack is greater than the width of the respective conductor.

7. A method as claimed in claim 6, wherein the capacitor layers further comprise a second metal layer adjacent the set of photodiode layers.

8. A method as claimed in claim 6, wherein the capacitor layers are provided over the conductors, and the photodiode layers are provided over the capacitor layers, the first metal contact layer thereby contacting the conductors.

9. A method as claimed in claim 6, wherein the photodiode layers are provided over the conductors, and the capacitor layers are provided over the photodiode layers, the first metal contact layer thereby contacting the second contact layer.

10. A method as claimed in claim 6, further comprising the step of preventing deposition of, or removing, the capacitor dielectric layer from areas of the substrate outside the array of photosensitive pixels.

* * * * *